(12) United States Patent
Marty et al.

(10) Patent No.: US 9,530,817 B2
(45) Date of Patent: Dec. 27, 2016

(54) BACK SIDE ILLUMINATION PHOTODIODE OF HIGH QUANTUM EFFICIENCY

(71) Applicants: STMicroelectronics SA, Montrouge (FR); Commissariat A L'Energie Atomique et aux Energies Alternatives, Paris (FR)

(72) Inventors: Michel Marty, Saint Paul de Varces (FR); Laurent Frey, Grenoble (FR)

(73) Assignees: STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 95 days.

(21) Appl. No.: 14/953,973

(22) Filed: Nov. 30, 2015

(65) Prior Publication Data

US 2016/0093662 A1   Mar. 31, 2016

Related U.S. Application Data

(62) Division of application No. 14/464,793, filed on Aug. 21, 2014, now Pat. No. 9,231,014.

(30) Foreign Application Priority Data

Aug. 23, 2013   (FR) ...................... 13 58141

(51) Int. Cl.
*H01L 29/06* (2006.01)
*H01L 27/14* (2006.01)
(Continued)

(52) U.S. Cl.
CPC ..... *H01L 27/14685* (2013.01); *H01L 27/1464* (2013.01); *H01L 27/14621* (2013.01);
(Continued)

(58) Field of Classification Search
CPC ............... H01L 27/14685; H01L 27/14621; H01L 27/1464; H01L 31/107
(Continued)

(56) References Cited

U.S. PATENT DOCUMENTS 6,583,438 B1 * 6/2003 Uchida ............... G02B 3/0012
257/291
6,587,147 B1 * 7/2003 Li ........................... G01J 1/04
348/280

(Continued)

FOREIGN PATENT DOCUMENTS

EP              1785750 A1    5/2007
WO    WO-2012032495 A1    3/2012

OTHER PUBLICATIONS

INPI Search Report and Written Opinion for FR 1358141 mailed Jun. 20, 2014 (7 pages).
EP Search Report for EP14181928 dated Jan. 14, 2015 (2 pages).

*Primary Examiner* — Dzung Tran
(74) *Attorney, Agent, or Firm* — Gardere Wynne Sewell LLP

(57) ABSTRACT

A back side illumination photodiode includes a light-receiving back side surface of a semiconductor material substrate. An area of the light-receiving back side surface includes a recess. The recess is filled with a material having an optical index that is lower than an optical index of the semiconductor material substrate. Both the substrate and the filling material are transparent to an operating wavelength of the photodiode. The recess may be formed to have a ring shape.

15 Claims, 4 Drawing Sheets

(51) Int. Cl.
    *H01L 31/062*     (2012.01)
    *H01L 21/00*     (2006.01)
    *H01L 27/146*     (2006.01)
    *H01L 31/0232*     (2014.01)
    *H01L 31/107*     (2006.01)
    *H01L 31/0352*     (2006.01)

(52) U.S. Cl.
    CPC .. *H01L 27/14625* (2013.01); *H01L 27/14627* (2013.01); *H01L 27/14643* (2013.01); *H01L 31/02327* (2013.01); *H01L 31/035236* (2013.01); *H01L 31/107* (2013.01)

(58) Field of Classification Search
    USPC ........................................ 257/21; 438/73, 59
    See application file for complete search history.

(56) References Cited

U.S. PATENT DOCUMENTS

| | | | |
|---|---|---|---|
| 6,852,562 B1 | 2/2005 | Hopper et al. | |
| 2005/0274968 A1 | 12/2005 | Kuo et al. | |
| 2006/0043519 A1 | 3/2006 | Ezaki | |
| 2006/0249804 A1* | 11/2006 | Mouli | H01L 27/14627 257/432 |
| 2006/0278948 A1 | 12/2006 | Yamaguchi et al. | |
| 2008/0074520 A1* | 3/2008 | Matsuda | H01L 27/14627 348/294 |
| 2008/0272454 A1 | 11/2008 | Toshikiyo et al. | |
| 2011/0298072 A1* | 12/2011 | Chuang | H01L 27/1462 257/432 |
| 2013/0075591 A1 | 3/2013 | Otake et al. | |
| 2013/0099343 A1 | 4/2013 | Toshikiyo et al. | |
| 2013/0161775 A1 | 6/2013 | Boutami et al. | |

* cited by examiner

BACK SIDE ILLUMINATION PHOTODIODE OF HIGH QUANTUM EFFICIENCY

CROSS-REFERENCE TO RELATED APPLICATIONS

This application is a divisional application from U.S. Application for patent Ser. No. 14/464,793 filed Aug. 21, 2014, which claims the priority benefit of French Patent application number 1358141, filed on Aug. 23, 2013, the disclosures of which are hereby incorporated by reference.

TECHNICAL FIELD

The present disclosure relates to light-receiving diodes or semiconductor photodiodes, for example used as image sensor pixels.

BACKGROUND

FIG. 1 partially and schematically shows photodiodes, side by side, of a network of photodiodes, for example forming an image sensor. Each photodiode comprises a semiconductor area 1 for converting photons into electron-hole pairs. A complete photodiode comprises junctions (not shown) between semiconductor regions of opposite type to store electrons, and various read transistors for transferring electrons.

More specifically, FIG. 1 illustrates a network of BSI-type (Back Side Illumination) photodiodes. In this type of structure, semiconductor areas 1 currently have a thickness no greater than from 2 to 5 µm. Photodiodes 1 are separated by insulating regions 3, currently called DTI (Deep Trench Isolation) in the art. Under the semiconductor layer containing photodiodes 1 are formed various metallization levels 4 embedded in a succession of insulating layers generally designated with reference numeral 5. The assembly rests on a support or handle 7, currently a silicon wafer. On the upper side or back side of the structure, each of the photodiodes is topped with a filter 9 corresponding to the color to be detected by this photodiode. The red, green, and blue filters are designated with references R, G, and B. Each of filters 9 is topped with a microlens 10. Filters 9 and the upper surface of semiconductor layers 1 generally have a thin insulating layer 11, or an assembly of insulating layers forming an antireflection layer, provided between them.

PCT patent application WO2012/032495 (incorporated by reference) discloses that the introduction of light into the photodiode raises an issue when the lateral dimensions of the illuminated surface of a photodiode are very small, in the order of wavelength $\lambda$ of the light that the photodiode is intended to capture, or operating wavelength. Thus, such photodiodes of very small dimensions have a low quantum efficiency. The PCT patent application provides, to increase the quantum efficiency of the photodiode, arranging on the upper surface thereof a pad having lateral dimensions smaller than the lateral dimensions of the photodiode.

The PCT patent application specifies that the concerned photodiodes are of FSI or Front Side Illumination type. In this case, specific problems are posed due to the fact that the metallization network is on the side of the illumination source. As will be seen hereafter, the structure provided in the PCT patent application has disadvantages in the case of BSI-type photodiodes.

Thus, a problem arises to absorb the maximum possible number of photons in structures such as that shown in FIG. 1, in the case of pixels of small dimensions, that is, having lateral dimensions in the range from one to five times the operating wavelength. More generally, the smaller the collection area, the more the quantum efficiency of the device is a problem. This problem more or less arises in all semiconductor photodiodes.

It should thus be noted that in photodiodes of very small dimensions, an increase, even low, of the quantum efficiency or absorption rate of the useful portion of the photodiode is in practice extremely important for the detection of low-intensity light. Thus, an efficiency gain from 1 to 5% will be considered as a significant gain by the user.

SUMMARY

Thus, an embodiment provides a BSI back-side illumination photodiode, wherein at least one area of the light-receiving surface of the photodiode comprises a recess filled with a material having an optical index lower than that of the semiconductor material of the photodiode, said material of lower optical index being transparent to the operating wavelength of the photodiode.

According to an embodiment, the lateral dimensions of the area are smaller than the operating wavelength of the photodiode.

According to an embodiment, the area is ring-shaped.

According to an embodiment, the light-receiving surface has lateral dimensions in the range from once to twice the operating wavelength.

According to an embodiment, the semiconductor material is silicon and the material of lower optical index is silicon oxide.

According to an embodiment, the internal lateral dimension of the ring is in the range between approximately 200 and approximately 500 nm and its external lateral dimension is in the range between approximately 450 and approximately 650 nm for an operating wavelength corresponding to red.

An embodiment provides a method of manufacturing a photodiode such as hereabove, comprising a prior simulation step to determine the dimensions of the recesses according to the selected materials and to the operating wavelength.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
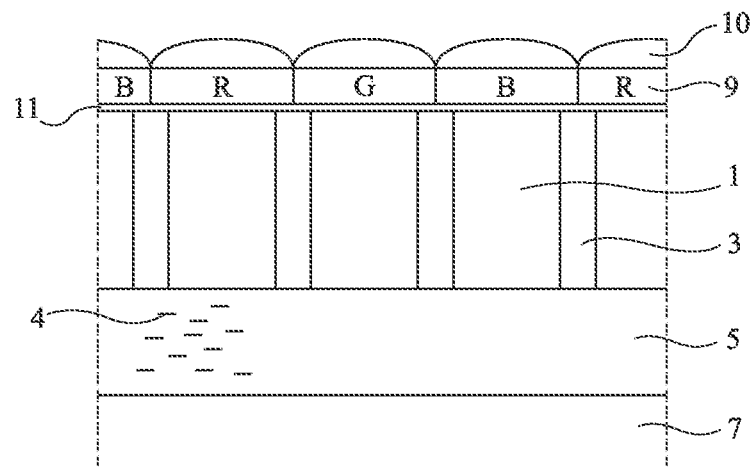
FIG. 1 very schematically shows, in cross-section view, a portion of a network of photodiodes of small dimensions.

For clarity, the same elements have been designated with the same reference numerals in the various drawings and, further, as usual in the representation of integrated circuits, the various drawings are not to scale.

Figure 2:
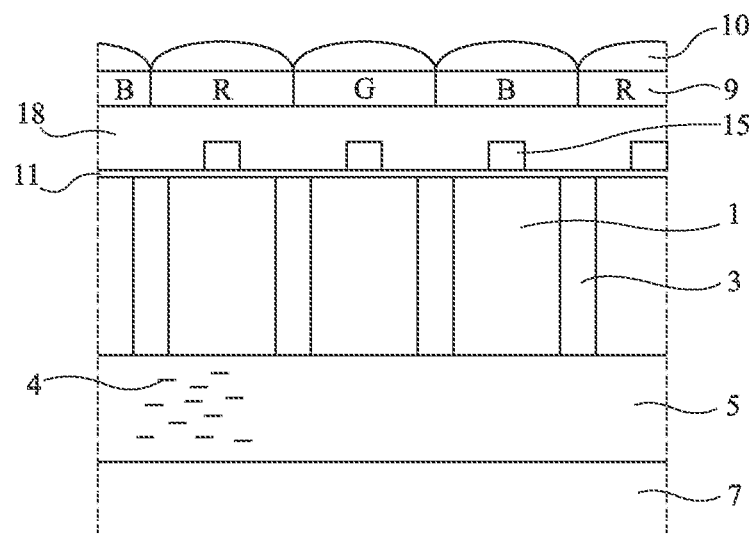
FIG. 2 very schematically shows, in cross-section view, a portion of a network of photodiodes of small dimensions provided with diffraction pads.

FIG. 2 shows an attempt to improve the quantum efficiency of each photodiode of the network of BSI photodiodes of FIG. 1. It shows the same elements as those already shown in FIG. 1, designated with the same reference numerals. Further, a pad 15 has been added above each photodiode (like that taught by PCT patent application WO2012032495). One should expect to find the advantageous quantum efficiency increase results described in the PCT patent application. However, adopting such a structure causes the occurrence of another disadvantage. Indeed, R, G, B filters 9 need to be deposited above a very planar layer. To achieve this, above pads 15, a planarization layer 18 is deposited with a total thickness which should be greater than that of the pad to provide a satisfactory planarization. The thickness of planarization layer 18 is in practice greater than from 400 to 800 nm. The presence of relatively thick layer 18 between the filters and the upper surface of active areas 1 of the photodiodes raises crosstalk issues, that is, light having crossed a lens associated with a filter of a given color risks laterally dispersing in layer 18 and reaching a semiconductor region 1 normally associated with another filter. Such crosstalk problems are all the greater as the pixels are small.

On the other hand, the forming of pad structures and of planarization layers on the rear surface of a BSI photodiode raises manufacturing issues.

Figure 3:
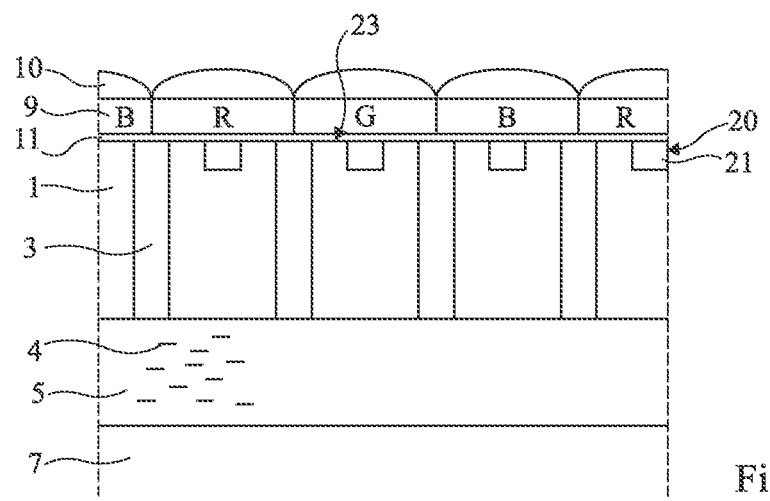
FIG. 3 shows, in cross-section view, an embodiment of pixels of a network of photodiodes of small dimensions.

FIG. 3 shows the same elements as in FIG. 1 designated with the same reference numerals.

It should again be reminded that the structure of photodiode 1 comprises various junctions, not shown, formed from the front surface of the structure, that is, the non-illuminated surface on the side of interconnection levels 4. Also, on the front surface side, various transistors intended for the connection of the photodiodes and for the reading of the charges stored therein after an illumination are formed in portions of semiconductor region 1.

In the embodiment of FIG. 3, on the rear surface side of photodiodes 1, recesses 20 having a material 21 of optical index lower than the optical index of semiconductor material 1 inserted therein are dug into receiving surface 23 of each of the photodiodes. Material 21 for example is silicon oxide in the case where semiconductor material 1 is silicon. However, in this case, any material of lower index than silicon may be used, provided for it to be transparent to the operating wavelength of the considered photodiode.

In the embodiment of FIG. 3, recesses 20 filled with material 21 associated with each of the photodiodes has been shown for the three colors, R, G, B. In practice, the greater problem is posed for photodiodes associated with red filters, which have the lowest probability of interaction between a photon and the semiconductor material to form an electron-hole pair. Recesses 20 filled with material 21 may thus be provided only for photodiodes associated with color red and for photodiodes associated with infrared light detection, if provided.

Figure 4A:
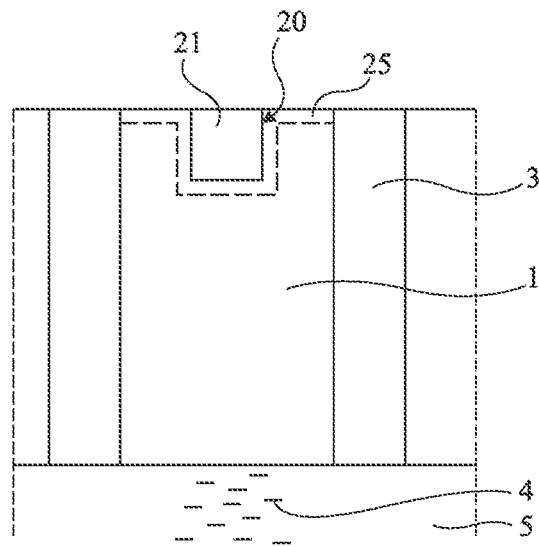
FIGS. 4A and 4B respectively are enlarged cross-section and top views of a portion of FIG. 3.
Figure 4B:
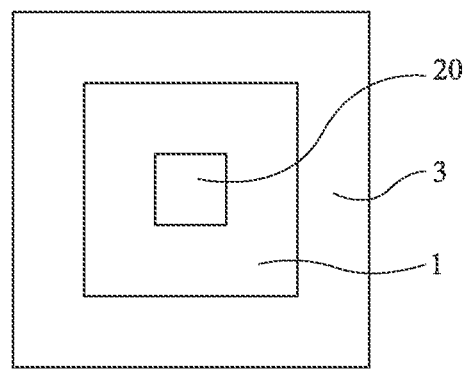

FIGS. 4A and 4B respectively are an enlarged cross-section view and a top view of a photodiode of FIG. 3. It shows semiconductor material 1 of the photodiode delimited by a peripheral insulating region 3. Interconnection network 4 embedded in an insulator 5 is shown at the bottom of the drawing (non-illuminated front surface of the photodiode).

It can be seen in these drawings that recess 20 filled with material 21 has a substantially square shape in top view. This shape will preferably be curved, in a ring. Further, in top view, the photodiode will not necessarily have a square cross-section and may have a round, rectangular, or oval shape.

FIG. 4A also shows, in dotted lines, the limit of an area 25 having, after the forming of the recess, a dopant of same conductivity type as the dopant of semiconductor material 1 of the photodiode, but with a stronger doping level, implanted therein. Such an additional doping is intended to limit carrier recombination problems at the interface between the semiconductor portion and an insulator which covers it and thus takes part in decreasing the dark current of the photodiode.

Figure 5A:
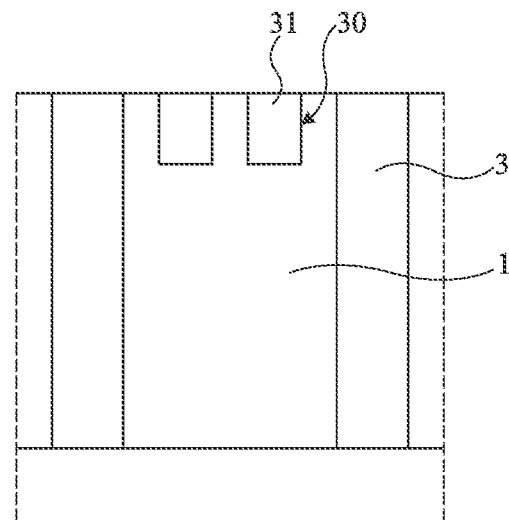
FIGS. 5A and 5B respectively are enlarged cross-section and top views of a portion of an embodiment of an alternative photodiode.
Figure 5B:
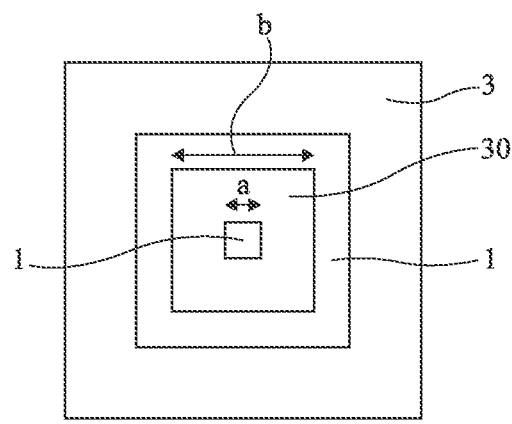

FIGS. 5A and 5B are cross-section and top views similar to FIGS. 4A and 4B. The same elements have been designated with the same reference numerals therein. In this embodiment, a recess 30 containing a material 31 has a ring shape. Such a structure provides a particularly marked photodiode quantum efficiency gain.

Figure 6:
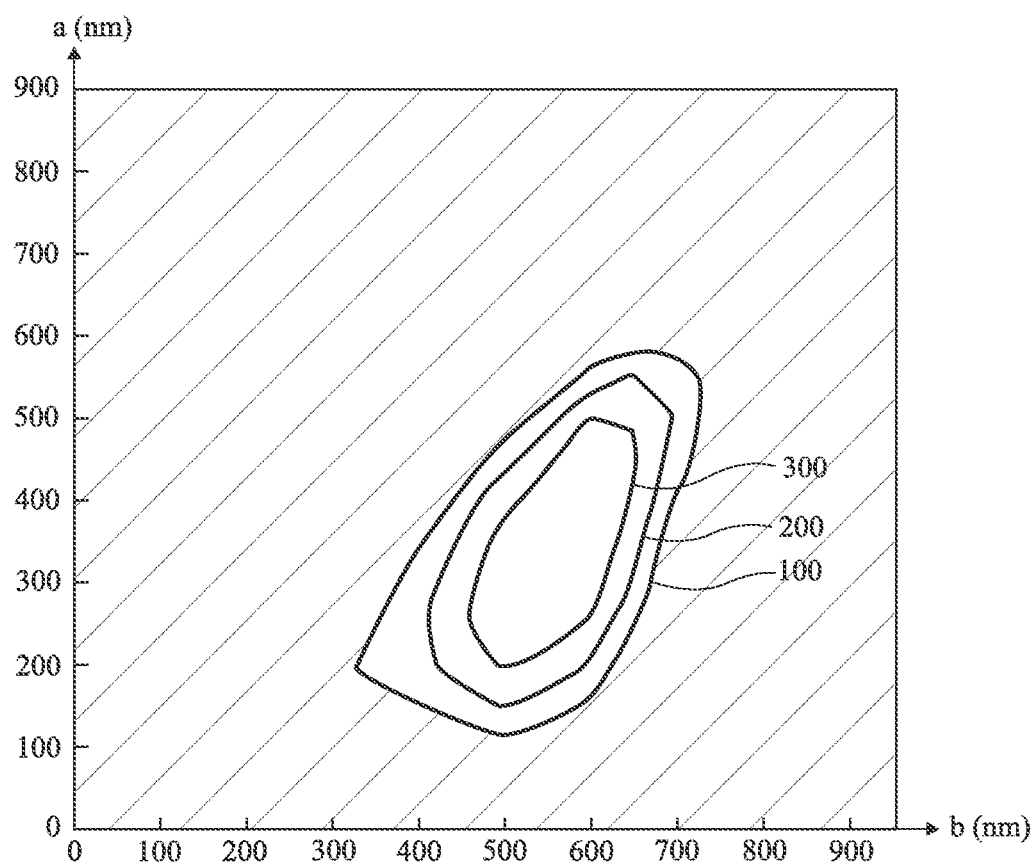
FIG. 6 is a chart illustrating the absorption gain in a photodiode of the type in FIGS. 5A and 5B as compared with the case of a photodiode of the type in FIG. 1.

Calling "a" the internal dimension of the ring and "b" the external dimension of the ring, FIG. 6 is a chart indicating, according to values a and b, the absorption of light by a photodiode. The chart of FIG. 6 is drawn in the case where the semiconductor is silicon having a 3-μm thickness and where ring 30 is filled with silicon oxide, the depth of the ring-shaped recess being 50 nm and for a red light having a wavelength in the order of 600 nm.

Under such conditions, for a photodiode such as in FIG. 1, provided with an antireflection layer but without any specific diffracting structure, the absorption is 80.7%. For a structure of the type in FIGS. 5A and 5B, provided with an antireflection layer, the absorption becomes, as illustrated in FIG. 6, greater than 81% inside of a curve 100, greater than 82% inside of a curve 200, and greater than 84% inside of a curve 300.

Thus, in this specific case, it can be seen that the absorption gain induced by the diffusing ring is maximum when the internal lateral dimension of the ring is in the range between approximately 200 and approximately 500 nm and its external lateral dimension is in the range between approximately 450 and approximately 650 nm.

Generally, it will be within the abilities of those skilled in the art to obtain the chart of FIG. 6 and to optimize the dimensions with conventional simulation methods, by using simulation programs such as software DiffractMOD (www.rsoftdesign.com) or software Grating Toolbox (www.lighttrans.com). Thus, provided to perform this previous simulation calculation, it will be within the abilities of those skilled in the art, with no trial and error, to form diffracting rings of suitable dimensions to increase the quantum efficiency or photon absorption of a photodiode.

Of course, the present invention is likely to have various alterations, modifications, and improvements, especially as concerns the materials used, which may be any selected materials, provided for them to be transparent to the operating wavelength and to respect the previously-discussed relations between indexes. If the technology leads to using other materials than silicon and silicon oxide, simulation programs such as those indicated previously will enable to determine the optimal dimensions of the rings to be used, with no trial and error.

In the various embodiments of FIGS. 4A-4B and 5A-5B, the recess will preferably have a depth in the range between one fifth and half the operating wavelength of the photodiode.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method fabricating a back side illumination (BSI) photodiode, comprising:
   forming a recess in at least one area of a light-receiving back surface of a semiconductor layer within which a photosensitive region for the back side illumination (BSI) photodiode is provided; and
   filling the recess with a material having an optical index different from an optical index of the semiconductor layer to form a diffracting structure;
   wherein said filling material is transparent to an operating wavelength of the BSI photodiode.

2. The method of claim 1, further comprising, before forming and filling: performing a diffraction simulation regarding said BSI photodiode according to said material and an operating wavelength in order to determine dimensions of said recess.

3. The method of claim 1, wherein the material has a lower optical index than the optical index of the semiconductor layer.

4. The method of claim 1, wherein the recess in the shape of a ring having an inner diameter and an outer diameter.

5. The method of claim 4, further comprising, before forming and filling: performing a diffraction simulation regarding said BSI photodiode according to said material and an operating wavelength in order to determine the inner and outer diameter dimensions of said recess.

6. The method of claim 4, wherein the inner diameter is in the range between approximately 200 and approximately 500 nm and wherein the outer diameter is in the range between approximately 450 and approximately 650 nm.

7. The method of claim 1, further comprising implanting dopant of a same conductivity type as present in the semiconductor layer, but at a higher dopant concentration, adjacent sides of the recess.

8. The method of claim 7, wherein filling is performed after implanting.

9. The method of claim 1, wherein the material is silicon oxide.

10. The method of claim 1, further comprising implanting dopant of a same conductivity type as present in the semiconductor layer, but at a higher dopant concentration, adjacent a bottom of the recess.

11. The method of claim 10, wherein filling is performed after implanting.

12. The method of claim 1, further comprising implanting dopant of a same conductivity type as present in the semiconductor layer, but at a higher dopant concentration, at the light-receiving back surface.

13. The method of claim 1, wherein a lateral dimension of said recess is smaller than an operating wavelength of the BSI photodiode.

14. The method of claim 1, further comprising forming an an electrical interconnection network on a front side surface of the semiconductor layer opposite the light-receiving back surface.

15. The method of claim 1, further comprising:
   forming a color filter layer over the light-receiving back surface; and
   forming a lens over the color filter layer.

* * * * *